(12) United States Patent
Yuasa

(10) Patent No.: US 7,688,140 B2
(45) Date of Patent: Mar. 30, 2010

(54) DIFFERENTIAL AMPLIFIER CIRCUIT

(75) Inventor: Tachio Yuasa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 51 days.

(21) Appl. No.: 11/905,374

(22) Filed: Sep. 28, 2007

(65) Prior Publication Data
US 2008/0079491 A1 Apr. 3, 2008

(30) Foreign Application Priority Data
Sep. 29, 2006 (JP) ............................. 2006-268349

(51) Int. Cl.
*H03F 3/45* (2006.01)
(52) U.S. Cl. .................. 330/253; 330/252; 330/257
(58) Field of Classification Search .................. 330/253, 330/255, 257, 262
See application file for complete search history.

(56) References Cited

U.S. PATENT DOCUMENTS 6,664,941 B2  12/2003  Itakura et al.
7,057,459 B2 *  6/2006  Ueno ......................... 330/255

FOREIGN PATENT DOCUMENTS

JP  11-150427  6/1999

OTHER PUBLICATIONS

Behzad Razavi, "Design of Analog CMOS Integrated Circuits", McGraw-Hill Higher Education, 2001, p. 326.

\* cited by examiner

*Primary Examiner*—Robert Pascal
*Assistant Examiner*—Hieu P Nguyen
(74) *Attorney, Agent, or Firm*—McGinn IP Law Group, PLLC

(57) ABSTRACT

Disclosed is a differential amplifier circuit that comprises: a first differential pair of a first conductivity type having an input pair connected to respective input terminals and an output pair connected to a load-element pair; a second differential pair of a second conductivity type having an input pair connected to the respective input terminals and an output pair connected to a load-element pair; a first output transistor connected between a first power supply and an output terminal and having a control terminal connected to a first output of the first differential pair; and a second output transistor connected between a second power supply and the output terminal and having a control terminal connected to a first output of the second differential pair. A current having a value that is the result of adding a current, which is the result of reflecting a current of the second output of the second differential pair by a current mirror, to a current of the first output of the first differential pair, is passed into the load element connected to the first output of the first differential pair. A current having a value that is the result of adding a current, which is the result of reflecting a current of the second output of the first differential pair by a current mirror, to a current of the first output of the second differential pair, is passed into the load element connected to the first output of the second differential pair.

19 Claims, 4 Drawing Sheets

FIRST DIFFERENTIAL AMPLIFIER CIRCUIT   SECOND DIFFERENTIAL AMPLIFIER CIRCUIT

DIFFERENTIAL AMPLIFIER CIRCUIT

RELATED APPLICATION

This application is based upon and claims the benefit of the priority of Japanese patent application No. 2006-268349, filed on Sep. 29, 2006, the disclosure of which is incorporated herein in its entirety by reference thereto.

FIELD OF THE INVENTION

This invention relates to a differential amplifier circuit and, more particularly, to a differential amplifier circuit in which an input differential stage has at least two differential pairs of different polarities.

BACKGROUND OF THE INVENTION

With the progress in fabricating process of semiconductors in recent years, there has been a great reduction in the dimensions of MOSFETs used in LSI chips, in which a CMOSFET (Complementary Metal Oxide Semiconductor Field-Effect Transistor) is a circuit element. The voltage that can be applied to a MOSFET also is continuing to be reduced. Further, owing to requests for improved performance and increasing demand for various portable electronic devices and progress that has been made in batteries and peripherals other than the LSIs that construct these devices, and because of social demand for conservation of device operating power, which is related to the demand for better performance, and conservation of resources necessary when producing these devices, there is increasing demand for a reduction in the power-supply voltage and signal input/output amplitude of these devices.

As power-supply voltage and input/output signal amplitude, especially input signal amplitude, are reduced, there is increasing demand for a ratio of input signal amplitude to power-supply voltage that will allow an electronic circuit constituting an electronic device to operate normally. For example, in both an Nch-type MOSFET and Pch-type MOSFET, there is a limitation upon the effective voltage range of input voltage in enhancement-type FETs, which are used heavily in ordinary CMOSLSI chips. In an enhancement-type FET, there exists a threshold-value voltage that is unsupportable as an effective input voltage for the purpose of holding output current in the OFF state. If the input voltage applied to the gate is equal to or greater than a threshold-value voltage with respect to the source voltage in an Nch-type MOSFET or if it is less than a value obtained by subtracting the threshold-value voltage from the source voltage in a Pch-type MOSFET, then the input voltage is not supportable as an effective input voltage. The reason for this is that the MOSFET turns off if the gate-to-source voltage (or the absolute value thereof) is smaller than the threshold-value voltage (or the absolute value thereof).

Owing to lowering of power-supply voltage and a reduction in input signal amplitude, the ratio of the threshold-value voltage of a FET to the input voltage range increases, i.e., the ratio of the range of the input voltage that cannot be received as the effective input voltage increases, and the performance of the electronic circuitry essentially declines. Accordingly, there is growing demand for application of circuit techniques to enlarge a range supportable as effective input voltages in a MOSFET, for example, without being aware of the presence of the threshold-value voltage. A circuit known in the prior art obtains the final output signal by combining a differential amplifier having, e.g., an Nch-type MOSFET as the input section and a differential amplifier having a Pch-type MOSFET as the input section, and combining the output signals of the differential amplifier circuits. FIG. 7 is a diagram illustrating an example of the configuration of a typical differential amplifier circuit.

The circuit shown in FIG. 7 has a plus (non-inverting) input terminal IP, a minus (inverting) input terminal IM and an output terminal O. The operation of the terminals is as illustrated in FIG. 2, which shows the symbol of an ordinary differential-input and single-output type differential amplifier circuit. If we let VP, VM and VO represent input voltage to the non-inverting input terminal IP, input voltage to the inverting input terminal IM and output voltage from the output terminal O, respectively, the relationship among these is given by Equation (1) below.

$$VO = A \times (VP - VM) \quad (1)$$

Here A represents an amplification factor of a differential-input and single-output type differential amplifier.

In the circuit of FIG. 7, IC and ID represent equivalent constant-current sources, M33 to M38 represent Pch-type MOSFETs, M31, M32 and M39 to M42 represent Nch-type MOSFETs, and VB1 to VB3 represent bias-voltage sources.

The relationship among VP, VM and VO in the circuit of FIG. 7 is obtained as set forth below.

Let VDD represent power-source voltage, and let I31 to I34 represent the drain currents of the MOSFETs M31 to M34. For the sake of simplicity, let β(beta)x, Wx, Lx, Vthx, VDSx and VAx represent the gain coefficient β(beta), gate width, gate length, threshold-value voltage, drain-to-source voltage and Early voltage, respectively, of MOSFET Mx (where x is 31 to 34). If it is assumed that these MOSFETs are all operating in the saturation region, the relationships between the drain currents I31 to I34 and the input voltages VP, VM are given by Equations (2) to (5) below.

$$I31 = \frac{\beta_{31}}{2} \cdot \frac{W_{31}}{L_{31}} \cdot (VP - Vth_{31})^2 \left(1 + \frac{VDS_{31}}{VA_{31}}\right) \propto VP \quad (2)$$

$$I32 = \frac{\beta_{32}}{2} \cdot \frac{W_{32}}{L_{32}} \cdot (VM - Vth_{32})^2 \left(1 + \frac{VDS_{32}}{VA_{32}}\right) \propto VM \quad (3)$$

$$I33 = \frac{\beta_{33}}{2} \cdot \frac{W_{33}}{L_{33}} \cdot (VDD - VP + Vth_{33})^2 \left(1 + \frac{VDS_{33}}{VA_{33}}\right) \propto^{-1} VP \quad (4)$$

$$I34 = \frac{\beta_{34}}{2} \cdot \frac{W_{34}}{L_{34}} \cdot (VDD - VM + Vth_{34})^2 \left(1 + \frac{VDS_{34}}{VA_{34}}\right) \propto^{-1} VM \quad (5)$$

The MOSFETs M35 and M36 essentially operate as equivalent constant-current sources supplied with respective bias voltages. If we let I35 and I36 represent the drain currents of MOSFETs M35 and M36, respectively, then Equations (6) and (7) below are obtained.

$$I35 - I31 = I41 - I33 \quad (6)$$

$$I36 - I32 = I42 - I34 \quad (7)$$

The output voltage VO in the output circuit constituted by MOSFETs M36, M38, M40 and M42 is proportional to the difference current between drain current I38 of MOSFET M38 and drain current I40 of MOSFET M40 and is represented by Equation (8) below.

$$VO \propto (I38 - I40) \quad (8)$$

Equation (9) below is derived from Equations (2) to (5) using Equations (6), (7), the fact that the drain currents I35 and I36 of MOSFETS M35 and M36 are equal and the fact that drain currents I41 and I42 of MOSFET M41 and M42 are also equal because it is considered desirable for the MOSFETs M41 and M42 to be operating as current mirror circuits in which the gate width/gate length ratio is 1.

$$I38 - I40 = I36 - I32 - (I42 - I34) \quad (9)$$

$$= I36 - I42 - I32 + I34$$

$$= I35 - I41 - I32 + I34$$

$$= I31 - I33 - (I32 - I34) \propto (VP - VM)$$

Accordingly, Equation (10) below is obtained from Equation (8) above.

$$VO \propto (VP-VM) \quad (10)$$

In view of the foregoing, it will be understood that the circuit of FIG. 7 operates as a differential amplifier circuit overall.

Reference is had to Patent Document 1, which describes a rail-to-rail amplifier having an extended range of common-mode input voltages. FIG. 25 in Patent Document 1 discloses a differential amplifier circuit in which currents that flow in a load-element pair (diode-connected P-channel MOS transistors Mp15 and Mp17) of a first differential pair comprising N-channel MOS transistors (Mn11 and Mn12) are reflected by a current mirror and flow in a load-element pair (Mn14 and Mn15) of a second differential pair comprising P-channel MOS transistors (Mp11 and Mp12).

[Patent Document 1]

Japanese Patent Kokai Publication No. JP-A-11-150427 (FIG. 25)

[Non-Patent Document 1]

Behzad Razavi, "Design of Analog CMOS Integrated Circuit", McGraw-Hill Higher Education, 2000, p. 326

I have now discovered that the entire disclosure of Patent Document 1 and Non-Patent Document 1 are incorporated herein by reference thereto.

In the differential amplifier circuit shown in FIG. 7, it is difficult to extend the range of the input voltage, output voltage and operating currents of the circuitry. This is derived from Equations (6), (7) indicating the operating requirements of the circuit.

For example, if the drain currents I31 and I32 of MOSFETs M31 and M32 do not fall within the following limits:

$$I31 < I35 \quad (11)$$

$$I32 < I36 \quad (12)$$

then the output circuit constituted by the MOSFETs M35 to M42 will no longer operate normally.

This limitation is mitigated if the drain current I35 of MOSFET M35 or the drain current I36 of MOSFET M36 can be made sufficiently large. In this case, however, power-supply current consumption of the overall circuit increases.

In order for the MOSFETs M37 to M40 to operate normally, it is required that the current values $$\left.\begin{array}{l} M37: I35 - I31 \\ M38: I36 - I32 \\ M39: I41 - I33 \\ M40: I42 - I34 \end{array}\right\} \quad (13)$$

with regard to respective ones of these MOSFETs fall within limits decided by the relationship between bias voltages VB2 and VB3 being applied to the MOSFETs M37 to M40.

Furthermore, if it is attempted to extend the range of the output voltage VO too much, there is the possibility that the drain-to-source voltage of the MOSFETs M38, M40 will decline and that there will be a departure from the normal operating range decided by the relations of Equation (13).

Thus, it is evident that if at least one of the MOSFETs M37 to M40 does not operate normally, the overall differential amplifier circuit will cease operating normally.

The reason why it is difficult to extend the range of the input voltage, output voltage and operating currents of the circuitry in the differential amplifier circuit shown in FIG. 7 is that subtractive combination of separately generated currents is performed in the combining of the output current of the differential amplifier circuit having Nch-type MOSFETs M31 and M32 as an input stage and the output current of the differential amplifier circuit having Pch-type MOSFETs M33 and M34 as an input stage. Another reason is that MOSFETs separate from the differential amplifier circuit are inserted directly in the paths of these current signals.

SUMMARY

According to the present invention, there is provided a differential amplifier circuit configured as follows.

In one aspect of the present invention, a differential amplifier circuit is adapted to additively combine the output currents of first and second differential amplifiers the polarities of which differ from each other.

Specifically, a differential amplifier circuit according to the present invention comprises: an input stage including a first differential pair of a first conductivity type having an input pair connected to respective first and second input terminals and an output pair connected to a load-element pair, and a second differential pair of a second conductivity type having an input pair connected to the respective first and second input terminals and an output pair connected to a load-element pair; and an output stage including a first output transistor connected between a first power supply and an output terminal and having a control terminal connected to a first output of the first differential pair, and a second output transistor connected between a second power supply and the output terminal and having a control terminal connected to a first output of the second differential pair; wherein a current having a value that is the result of adding a current of the first output of the second differential pair and a current, which is generated by a first current combining circuit based upon a current that flows through a second output of the first differential pair, flows in the load element connected to the first output of the second differential pair; and a current having a value that is the result of adding a current of the first output of the first differential pair and a current, which is generated by a second current combining circuit based upon a current that flows through a second output of the second differential pair, flows in the load element connected to the first output of the first differential pair.

In the differential amplifier circuit according to the present invention, the first current combining circuit has a first current mirror in which the load element connected to the second output of the first differential pair forms an input side, and which has an output connected to the load element connected to the first output of the second differential pair, wherein a current having a value that is the result of adding an output current of the first current mirror to the current of the first output of the second differential pair flows in the load element connected to the first output of the second differential pair. Further, the second current combining circuit has a second current mirror in which the load element connected to the second output of the second differential pair forms an input side, and which has an output connected to the load element connected to the first output of the first differential pair, wherein a current having a value that is the result of adding an output current of the second current mirror to the current of the first output of the first differential pair flows in the load element connected to the first output of the first differential pair.

In the present invention, the load element connected to the first output of the first differential pair and the first output transistor form a third current mirror, and the load element connected to the first output of the second differential pair and the second output transistor form a fourth current mirror.

According to another aspect of the present invention, the foregoing object is attained by providing a differential amplifier circuit comprising: an input stage including a first differential pair of a first conductivity type having an input pair connected to respective first and second input terminals and an output pair connected to a load-element pair, and a second differential pair of a second conductivity type having an input pair connected to the respective first and second input terminals and an output pair connected to a load-element pair; and an output stage including a first output transistor connected between a first power supply and a first output terminal and having a control terminal connected to a first output of the first differential pair, a second output transistor connected between a second power supply and the first output terminal and having a control terminal connected to a first output of the second differential pair, a third output transistor connected between the first power supply and a second output terminal and having a control terminal connected to a second output of the first differential pair, and a fourth output transistor connected between the second power supply and the second output terminal and having a control terminal connected to a second output of the second differential pair; wherein the load element connected to the first output of the first differential pair and the first output transistor form a first current mirror, the load element connected to the second output of the first differential pair and the third output transistor form a second current mirror, the load element connected to the first output of the second differential pair and the second output transistor form a third current mirror, and the load element connected to the second output of the second differential pair and the fourth output transistor form a fourth current mirror.

In the present invention, a phase-compensating capacitor is arranged in accordance with (A) or (B) or both (A) and (B):

(A) between the control terminal of the first output transistor and the output terminal, and between the control terminal of the second output transistor and the output terminal; and (B) between the output pair of the first differential pair and between the output pair of the second differential pair.

In the present invention, each of the load elements comprises a diode-connected transistor.

A differential amplifier circuit according to the present invention comprises: a first differential pair includes a transistor pair of a first conductivity type having coupled sources connected to a first current source, drains connected to first and second load elements and gates connected to respective ones of an inverting input terminal and non-inverting input terminal, wherein the first and second load elements comprise diode-connected transistors of a second conductivity type having sources connected to a first power supply. The differential amplifier circuit further includes a second differential pair comprising a transistor pair of the second conductivity type having coupled sources connected to a second current source, drains connected to third and fourth load elements and gates connected to respective ones of the inverting input terminal and non-inverting input terminal, wherein the third and fourth load elements comprise diode-connected transistors of the first conductivity type having sources connected to a second power supply. The differential amplifier circuit further includes a first output transistor of the second conductivity type connected between the first power supply and an output terminal and having a gate connected to a node of connection between the second load element and drain of the first differential pair; a second output transistor of the first conductivity type connected between the second power supply and the output terminal and having a control terminal connected to a node of connection between the fourth load element and drain of the second differential pair; a first transistor of the second conductivity type having a source connected to the first power supply and forming a current mirror with the first load element; and a second transistor of the first conductivity type having a source connected to the second power supply and forming a current mirror with the third load element. The first transistor has a drain connected to a node of connection between the drain and gate of the fourth load element, and the second transistor has a drain connected to a node of connection between the drain and gate of the second load element.

The meritorious effects of the present invention are summarized as follows.

In accordance with the present invention, the output currents of the first and second differential pairs are combined additively. This means that it is essentially impossible for the current value to become approximately zero. Consequently, there is no possibility of the circuit failing to operate normally.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

PREFERRED MODES OF THE INVENTION

Figure 1:
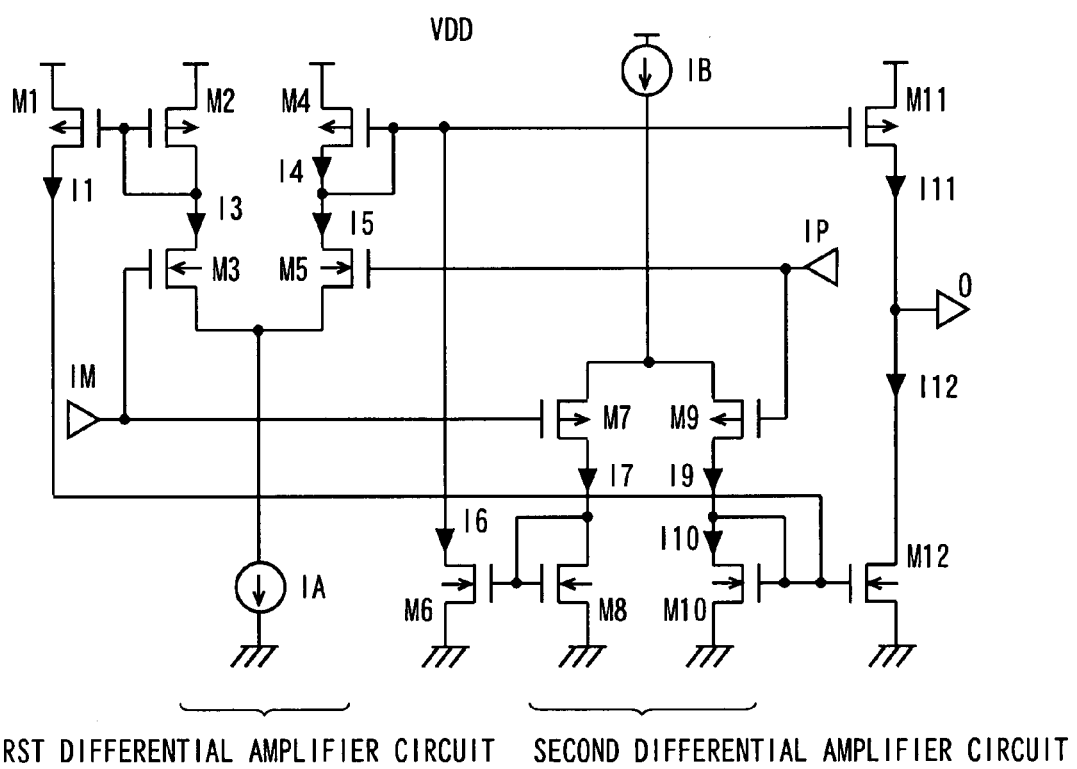
FIG. 1 is a diagram illustrating the configuration of a differential amplifier circuit according to a first embodiment of the present invention.

The present invention will be described in greater detail with reference to the accompanying drawings. As illustrated in FIG. 1, a differential amplifier circuit according to the present invention has a first differential amplifier circuit and a second differential amplifier circuit as an input stage. The first differential amplifier circuit includes a first differential pair (M3,M5) of a first conductivity type having an input pair connected to differential input terminals (inverting input terminal IM and non-inverting input terminal IP) and an output pair connected to a pair of load elements (M2,M4). The second differential amplifier circuit includes a second differential pair (M7,M9) of a second conductivity type having an input pair connected to differential input terminals (inverting input terminal IM and non-inverting input terminal IP) and an output pair connected to a pair of load elements (M8,M10). The differential amplifier circuit further has a first output transistor (M11) and a second output transistor (M12) as an output stage. The first output transistor (M11) is connected between a first power supply (VDD) and an output terminal (O) and has a control terminal connected to a first output (the output of M5) of the first differential pair. The second output transistor (M12) is connected between a second power supply (GND) and the output terminal (O) and has a control terminal connected to a first output (the output of M9) of the second differential pair (M7,M9). A current (I10) having a value that is the result of adding a current (I9) of the first output (the output of M9) of the second differential pair (M7,M9) and a current (I1), which is generated by a first current combining circuit (M1,M2) based upon a current (I3) that flows through a second output (the output of M3) of the first differential pair (M3,M5), flows in the load element (M10) connected to the first output (the output of M9) of the second differential pair (M7,M9). A current (I4) having a value that is the result of adding a current (I5) of the first output (the output of M5) of the first differential pair (M3,M5) and a current (I6), which is generated by a second current combining circuit (M6,M8) based upon a current (I7) that flows through a second output (the output of M7) of the second differential pair (M7,M9), flows in the load element (M4) connected to the first output (the output of M5) of the first differential pair (M3,M5).

In the differential amplifier circuit according to the present invention, the first current combining circuit has a first current mirror (M1,M2) in which the load element (M2) connected to the second output (the output of M3) of the first differential pair (M3,M5) forms the input side, and which has an output (the output of M1) connected to the load element (M10) connected to the first output (the output of M9) of the second differential pair (M7,M9), wherein a current (I10) having a value that is the result of adding an output current (I1) of the first current mirror (M1,M2) to the current (I9) of the first output (the output of M9) of the second differential pair (M7,M9) flows in the load element (M10) connected to the first output (the output of M9) of the second differential pair (M7,M9). The second current combining circuit has a second current mirror (M6,M8) in which the load element (M8) connected to the second output (the output of M7) of the second differential pair (M7,M9) forms the input side, and which has an output (the output of M6) connected to the load element (M4) connected to the first output (the output of M5) of the first differential pair (M3,M5), wherein a current (I4) having a value that is the result of adding an output current (I6) of the second current mirror (M6,M8) to the current (I5) of the first output (the output of M5) of the first differential pair (M3,M5) flows in the load element (M4) connected to the first output (the output of M5) of the first differential pair (M3,M5). Thus, the differential amplifier circuit according to the present invention additively combines the output currents of the first and second differential pairs of the input stage and passes the additively combined currents into the respective load elements of the first and second differential pair. Accordingly, a situation in which the current values of the load elements of the first and second differential pairs become approximately zero essentially cannot occur with respect to input voltages in the range from ground (GND) potential to the potential of the power supply, by way of example. Consequently, there is no possibility of the circuit failing to operate normally. Specific examples will now be described.

FIG. 1 is a diagram illustrating the configuration of a first example of the present invention. Referring to FIG. 1, there are provided (A) a current source (equivalent constant-current source) IA that has a first end connected to GND (ground potential);

(B) Nch-type MOSFETs M3 and M5 which form a first differential pair and which have coupled sources connected to the second end of the current source IA and gates connected to a minus (inverting) input terminal IM and plus (non-inverting) input terminal IP, respectively;

(C) a diode-connected Pch-type MOSFET M2 that has a source connected to power supply VDD and a drain connected to the drain of the Nch-type MOSFET M3; and (D) a diode-connected Pch-type MOSFET M4 that has a source connected to power supply VDD and a drain connected to the drain of the Nch-MOSFET M5.

Also provided is (E) a Pch-type MOSFET M1 that has a source connected to the power supply VDD and a gate connected to the gate of the Pch-type MOSFET M2. The Pch-type MOSFETs M2 and M4 compose an active load circuit of the differential pair M3 and M5, and the Pch-type MOSFETs M1 and M2 compose a current mirror. The current source IA, first differential pair (M3, M5), and active load circuit (M2, M4) compose a first differential amplifier circuit of an input stage. The current mirror (M1, M2) serves as a first current combining circuit.

Further provided are (F) a current source (equivalent constant-current source) IB that has a first end connected to power supply VDD;

(G) Pch-type MOSFETs M7 and M9 which form a second differential pair and which have coupled sources connected to the second end of the current source IB and gates connected to a minus (inverting) input terminal IM and plus (non-inverting) input terminal IP, respectively;

(H) a diode-connected Nch-type MOSFET M8 that has a source connected to GND and a drain connected to the drain of the Pch-type MOSFET M7; and (I) a diode-connected Nch-type MOSFET M10 that has a source connected to GND and a drain connected to the drain of the Pch-MOSFET M9.

Also provided is (J) an Nch-type MOSFET M6 that has a source connected to GND, a gate connected to the gate of the Nch-type MOSFET M8 and a drain connected to the gate of the diode-connected Pch-type MOSFET M4. The drain of the Pch-type MOSFET M1 is connected to the gate of the diode-connected Nch-type MOSFET M10. The Nch-type MOSFETs M8 and M10 compose an active load circuit of the differential pair M7 and M9, and the Nch-type MOSFETs M6 and M8 compose a current mirror. The current source IB, second differential pair (M7, M9), and active load circuit (M8, M10) compose a second differential amplifier circuit of the input stage. The current mirror (M6, M8) serves as a second current combining circuit.

Further, provided as an output circuit are (K) a Pch-type MOSFET M11 that has a source connected to the power supply, a drain connected to the output terminal O and a gate connected to the drain of the MOSFET M4; and (L) an Nch-type MOSFET M12 that has a source connected to GND, a drain connected to the output terminal O and a gate connected to the drain of the MOSFET M10. The MOSFETs M11 and M12 are also referred to as output transistors.

The MOSFET M4 of the first differential amplifier circuit and the output MOSFET M11 of the output circuit compose a current mirror, and the MOSFET M10 of the second differential amplifier circuit and the output MOSFET M12 of the output circuit compose a current mirror.

Figure 2:
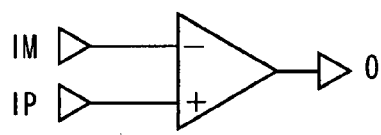
FIG. 2 is a diagram illustrating the symbol of a differential-input, single-output amplifier circuit and an example of terminal names.

If we let VP represent the input voltage to the non-inverting input terminal IP, VM the input voltage to the inverting input terminal IM and VO the output voltage from the output terminal O, then the relationship among these is given by Equation (1) cited above. A voltage VO (single-ended output) is output. The voltage VO is the result of differentially amplifying the input voltages VP, VM to the non-inverting input terminal IP and inverting input terminal IM, respectively, as illustrated in FIG. 2.

The relationship among VP, VM and VO in the circuit of FIG. 1 is obtained as set forth below.

Let VDD represent the power-source voltage, and let I3, I5, I7 and I9 represent the drain currents of MOSFETs M3, M5, M7 and M9, respectively. For the sake of simplicity, let β(beta)x, Wx, Lx, Vthx, VDSx and VAx represent the gain coefficient β(beta), gate width, gate length, threshold-value voltage, drain-to-source voltage and Early voltage, respectively, of MOSFET Mx (where x is 3, 5, 7, 9). If it is assumed that these MOSFETs are all operating in the saturation region, the relationships between the drain currents I3, I5, I and I9, and the input voltages VP and VM are given by Equations (14) to (17) below.

$$I3 = \frac{\beta_3}{2} \cdot \frac{W_3}{L_3} \cdot (VM - Vth_3)^2 \left(1 + \frac{VDS_3}{VA_3}\right) \propto VM \quad (14)$$

$$I5 = \frac{\beta_5}{2} \cdot \frac{W_5}{L_5} \cdot (VP - Vth_5)^2 \left(1 + \frac{VDS_5}{VA_5}\right) \propto VP \quad (15)$$

$$I7 = \frac{\beta_7}{2} \cdot \frac{W_7}{L_7} \cdot (VDD - VM + Vth_7)^2 \left(1 + \frac{VDS_7}{VA_7}\right) \propto^{-1} VM \quad (16)$$

$$I9 = \frac{\beta_9}{2} \cdot \frac{W_9}{L_9} \cdot (VDD - VP + Vth_9)^2 \left(1 + \frac{VDS_9}{VA_9}\right) \propto^{-1} VP \quad (17)$$

Accordingly, if we let I1, I4, I6 and I10 represent the drain currents of MOSFETs M1, M4, M6 and M10, respectively, and if we assume for the sake of simplicity that the gate width/gate length ratio of the MOSFETs M4, M11, M10 and M12 is 1, then Equations (18), (19) below are obtained.

$$I4 = I5 + I6 = I5 + I7 \quad (18)$$

$$I10 = I9 + I1 = I9 + I3 \quad (19)$$

If we let I11, I12 represent the drain currents of MOSFETs M11, M12, respectively, and if we assume for the sake of simplicity that the gate width/gate length ratio of the MOSFETs M4, M11, M10 and M12 is 1, then Equation (20) below is obtained.

$$\begin{aligned} I11 - I12 &= I4 - I10 \\ &= I5 + I7 - (I9 + I3) \\ &= I5 - I9 - (I3 - I7) \propto (VP - VM) \end{aligned} \quad (20)$$

In the output circuit composed by the MOSFETs M11 and M12, we have the following:

$$VO \propto (I11 - I12) \quad (21)$$

and therefore Equation (22) below is obtained.

$$VO \propto (VP - VM) \quad (22)$$

It will be understood from the foregoing that the circuit of FIG. 1 operates as a differential amplifier circuit. It should be noted that with regard to the first differential amplifier circuit that includes the first differential pair (M3 and M5) as the input differential stage and the second differential amplifier circuit that includes the second differential pair (M7 and M9) as the input differential stage in the circuit of FIG. 1, the ranges of VP and VM in which these circuits are capable of operating normally are as set forth in Table 1 below. Here Vthn and Vthp represent threshold-value voltages of Nch- and Pch-MOSFETs, respectively.

TABLE 1

| INPUT VOLTAGES VP, VM | DIFFERENTIAL AMPLIFIER CIRCUIT OPERATING NORMALLY |
| --- | --- |
| (VDD − Vthp) ~ VDD | FIRST DIFFERENTIAL AMPLIFIER CIRCUIT |
| Vthn ~ (VDD − Vthp) | FIRST AND SECOND DIFFERENTIAL AMPLIFIER CIRCUITS |
| 0 ~ Vthn | SECOND DIFFERENTIAL AMPLIFIER CIRCUIT |

It will be understood from Table 1 that if Equation (23) below is satisfied in the circuit of FIG. 1, at least one differential amplifier circuit will always be operating over the full range in which input voltages VP and VM applied to the non-inverting input terminal IP and inverting input terminal IM, respectively, are from 0 to VDD.

$$(VDD - Vthp) \leq Vthn \quad (23)$$

Accordingly, the differential amplifier circuit according to the present invention operates as a differential amplifier circuit of the so-called "rail-to-rail" input type, which is capable of operating for the input voltage over the full range of the power-supply voltage.

Figure 7:
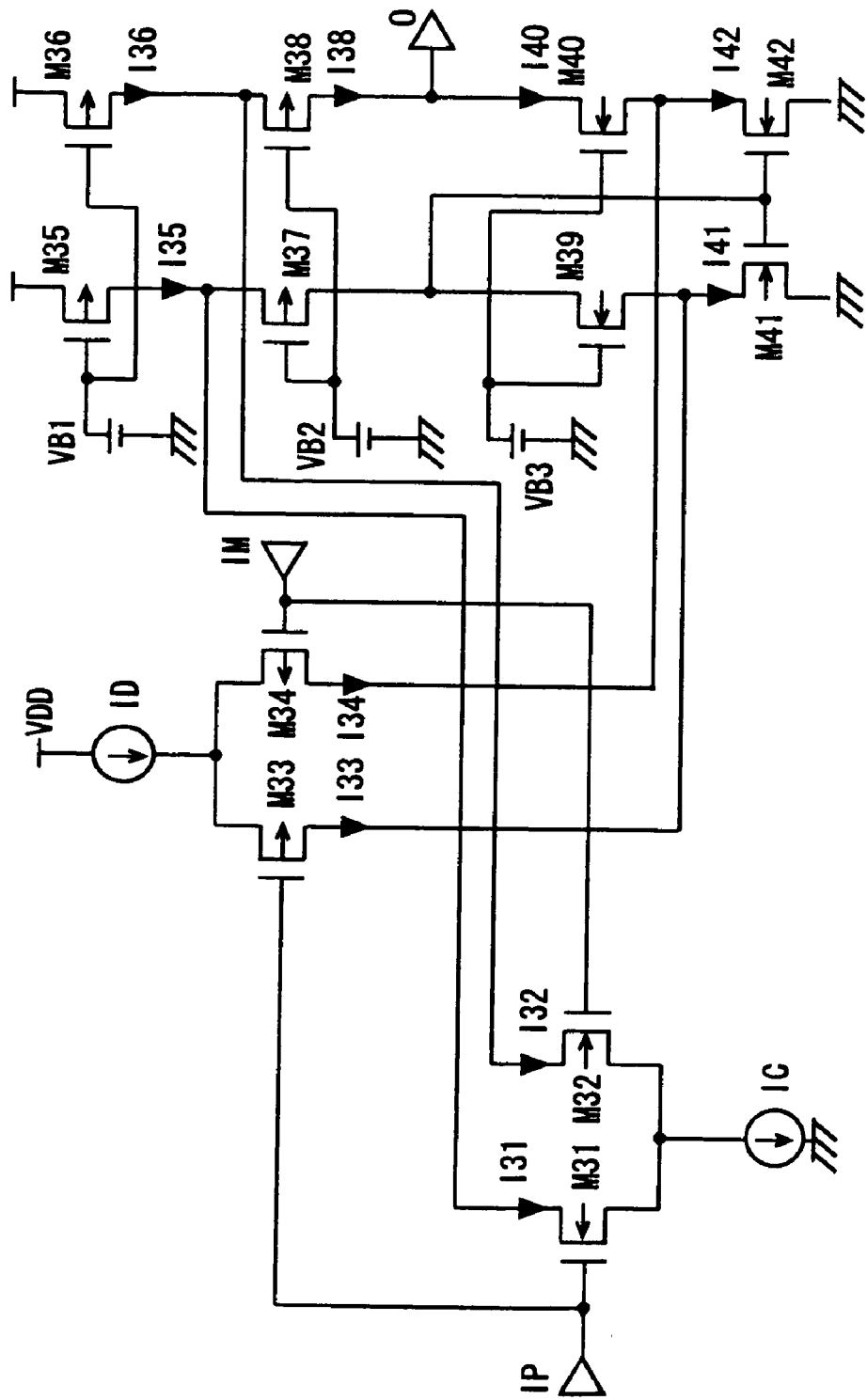
FIG. 7 is a diagram illustrating an example of the configuration of a typical differential amplifier circuit.

In the Equations (18), (19) indicating the requirements for operation of the circuit according to the first example of the invention, the use of additive combining is indicated in the combining of the output currents from the respective first and second differential amplifier circuits. Accordingly, the problem that arises with the differential amplifier circuit shown in FIG. 7 is solved.

More specifically, in relation to the drain current I5 of MOSFET M5 of the first differential pair (M3,M5) and drain current I7 of MOSFET M7 of the second differential pair (M7,M9), the current I7 is converted to current I6 temporarily by the current mirror circuit (MOSFETs M8, M6), whereupon currents I6 and I5 are added to obtain the current I4 that flows in the MOSFET M4 connected to the MOSFET M5 of the first differential pair (M3,M5). The drain current I11 (=I4) of MOSFET M11 of the output circuit is obtained by the current mirror circuit (comprising MOSFETs M4, M11).

Similarly, the current I3 of MOSFET M3 of the first differential pair (M3,M5) is converted to current I1 temporarily by the second current mirror circuit (comprising MOSFETs M2, M1), whereupon currents I1 and I9 are added to obtain the current I10. The drain current I12 (=I10) of MOSFET M12 of the output circuit is obtained by the current mirror circuit (comprising MOSFETs M10, M12).

The MOSFETs M11 and M12 compose a push-pull output circuit and the operation of Equation (21) is obtained in accordance with the values of the drain currents I11 and I12.

Figure 3:
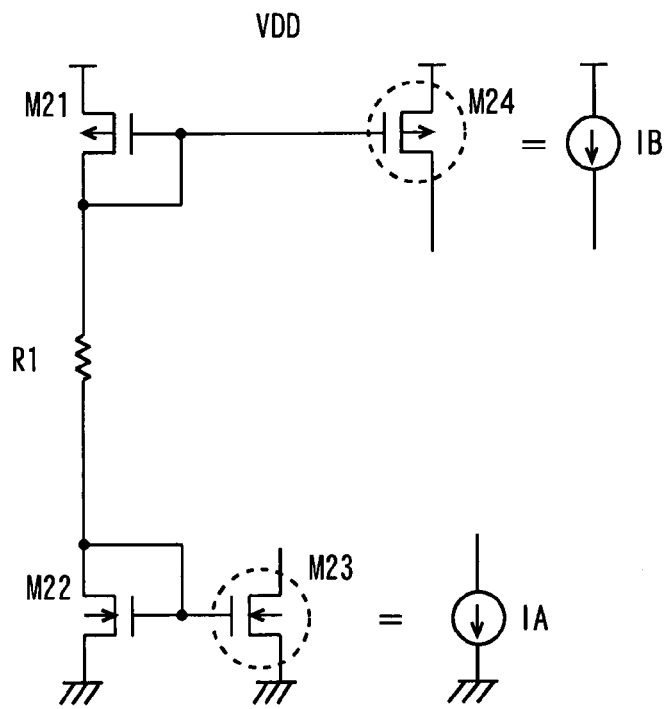
FIG. 3 is a diagram illustrating an example of the configuration of a constant-current source.

FIG. 3 is a diagram illustrating the specific configuration of the current sources IA and IB used as the equivalent constant-current sources of FIG. 1. The current source IA is constituted by an Nch-type MOSFET M23 that has a source connected to GND. The drain current of the Nch-type MOSFET M23 is adopted as the output current (sink current). The current source IB is constituted by a Pch-type MOSFET M24 that has a source connected to power supply VDD. The drain current of the Pch-type MOSFET M24 is adopted as the output current (source current). An Nch-type MOSFET M22 is provided as a circuit for applying a bias voltage to the current source IA and has a source connected to GND and a gate connected to its own drain and to the gate of the Nch-type MOSFET M23. A Pch-type MOSFET M21 is provided as a circuit for applying a bias voltage to the current source IB and has a source connected to VDD and a gate connected to its own drain and to the gate of the Pch-type MOSFET M24. The drain of the Nch-type MOSFET M22 and the drain of the Pch-type MOSFET M21 are connected via a resistor R1.

The circuit of FIG. 1 can also be used as a comparator (a voltage comparator). It can also be used as an operational amplifier. In this case, a phase compensation circuit generally is required in order to prevent oscillation, although this will depend upon circuit design and operating conditions, etc.

Figure 4:
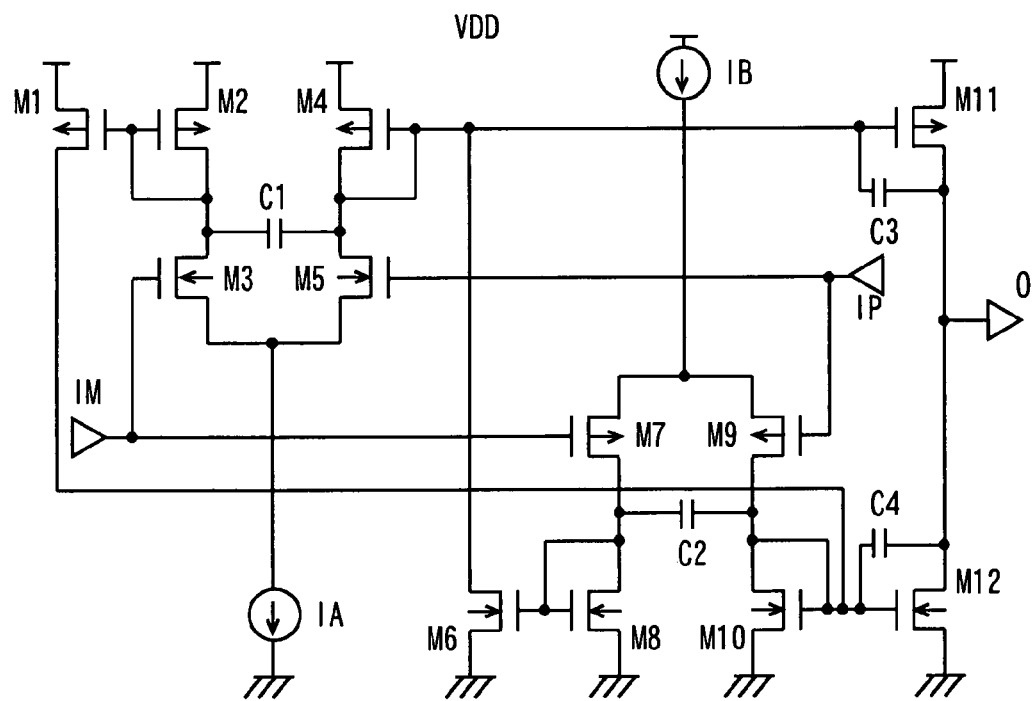
FIG. 4 is a diagram illustrating the configuration of a differential amplifier circuit according to a second embodiment of the present invention.

FIG. 4 is a diagram illustrating the configuration of a second example of the present invention. In FIG. 4, phase compensation circuits are provided in the form of capacitors C1 to C4. The configuration of FIG. 4 is obtained by adding on the capacitors C1 to C4 to the configuration of FIG. 1. The capacitors C1 and C2 are connected between output pair of the first differential pair (M3,M5) and the output pair of the second differential pair (M7,M9), respectively, and the capacitors C3 and C4 are connected between the drain and gate of MOSFET M11 and the drain and gate of MOSFET M12, respectively, of the output circuit. It should be noted that not all of the capacitors C1 to C4 are necessary. Depending upon the circuit design and operating conditions, it is possible to implement phase compensation using only capacitors C1 and C2 or only capacitors C3 and C4.

Figure 5:
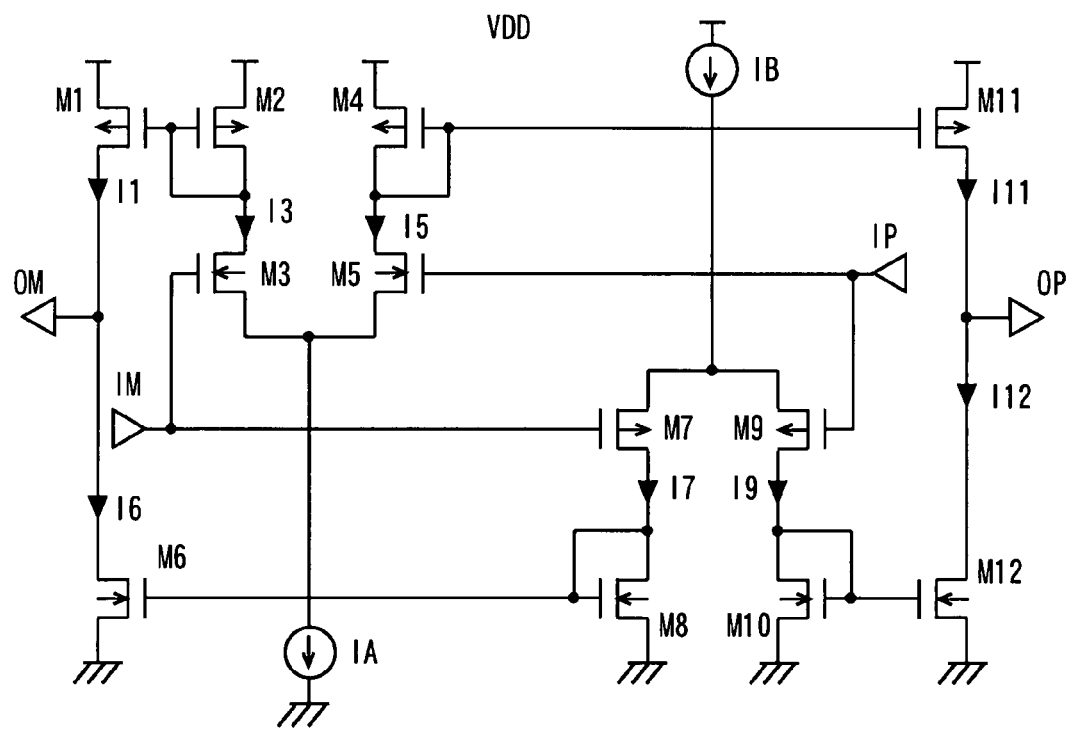
FIG. 5 is a diagram illustrating the configuration of a differential amplifier circuit according to a second embodiment of the present invention.
Figure 6:
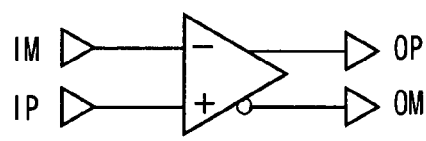
FIG. 6 is a diagram illustrating the symbol of a differential-input, differential-output amplifier circuit and an example of terminal names.

FIG. 5 is a diagram illustrating the configuration of a third example of the present invention. The first example of FIG. 1 illustrates the circuit configuration (see FIG. 2) in a differential-input, single-output (single-ended output) case. In the third example, however, the differential amplifier circuit has a differential-input, differential-output configuration, as illustrated in FIG. 6. The voltages at the non-inverting input terminal IP and inverting input terminal IM are differentially amplified, and a differential output is obtained from a non-inverting output terminal OP and an inverting output terminal OM. If we let VP represent the input voltage to the non-inverting input terminal IP, VM the input voltage to the inverting input terminal IM, VOP the output voltage from the output terminal OP and VOM the output voltage from the output terminal OM, then the relationship among these is given by Equation (24) below.

$$VOP-VOM=A\times(VP-VM) \qquad (24)$$

Where A represents a differential-input, differential-output differential amplification factor.

Referring to FIG. 5, there are provided (A) a current source (equivalent constant-current source) IA that has a first end connected to GND (ground potential);

(B) Nch-type MOSFETs M3 and M5 which form a first differential pair and which have coupled sources connected to a second end of the current source IA and gates connected to the minus (inverting) input terminal IM and plus (non-inverting) input terminal IP, respectively;

(C) a diode-connected Pch-type MOSFET M2 that has a source connected to power supply VDD and a drain connected to the drain of Nch-type MOSFET M3;

(D) a diode-connected Pch-type MOSFET M4 that has a source connected to power supply VDD and a drain connected to the drain of Nch-MOSFET M5; and (E) a Pch-type MOSFET M1 that has a source connected to the power supply VDD, a gate connected to the gate of the Pch-type MOSFET M2 and a drain connected to an inverting output terminal OM. The Pch-type MOSFETs M2 and M4 compose an active load circuit of the differential pair M3 and M5, and the Pch-type MOSFETs M1 and M2 compose a first current mirror.

Further provided are (F) a current source (equivalent constant-current source) IB that has a first end connected to power supply VDD;

(G) Pch-type MOSFETs M7 and M9 which form a second differential pair and which have coupled sources connected to current source IB and gates connected to the minus (inverting) input terminal IM and plus (non-inverting) input terminal IP, respectively;

(H) a diode-connected Nch-type MOSFET M8 that has a source connected to GND and a drain connected to the drain of Pch-type MOSFET M7;

(I) a diode-connected Nch-type MOSFET M10 that has a source connected to GND and a drain connected to the drain of Pch-type MOSFET M9; and (J) an Nch-type MOSFET M6 that has a source connected to GND, a gate connected to the gate of Nch-type MOSFET M8 and a drain connected to the inverting output terminal OM. The Nch-type MOSFETs M8 and M10 compose an active load circuit of differential pair M7 and M9, and the Nch-type MOSFETs M6 and M8 compose a second current mirror.

Further, provided as an output circuit of the non-inverting output terminal OP are (K) Pch-type MOSFET M11 (a first output transistor) that has a source connected to power supply VDD, a drain connected to the non-inverting output terminal OP and a gate connected to the drain of MOSFET M4, and the Pch-type MOSFETs M4 and M11 compose a third current mirror; and (L) Nch-type MOSFET M12 (a second output transistor) that has a source connected to GND, a drain connected to the non-inverting output terminal OP and a gate connected to the drain of MOSFET M10, and the Nch-type MOSFETs M10 and M12 compose a fourth current mirror.

The Pch-type MOSFET M1 (a third output transistor) and the Nch-type MOSFET M6 (a fourth output transistor) are provided as an output circuit of the inverting output terminal OM.

As indicated by Equation (21) above, the output voltage VOP of the non-inverting output terminal OP is proportional to a difference current I11-I12 between the drain currents I11 and I12 of the MOSFETs M11 and M12, respectively. Similarly, the output voltage VOM of the inverting output terminal OM is proportional to a difference current I1-I6 between the drain currents I1 and I6 of the MOSFETs M1 and M6, respectively. If we assume for the sake of simplicity that the gate width/gate length ratios of the MOSFETs M1 and M2, M6 and M8, M4 and M11 and M10 and M12 is 1, then the difference current between the output currents I1 and I6 of the MOSFETs M1 and M6 will be given by the difference current between I3 and I7. In view of I3 $\propto$ VM, I7 $\propto^{-1}$ VM, the output voltage VOM of the inverting output terminal OM is a voltage corresponding to the input voltage VM. Further, the difference current I11-I12 between the output currents I11 and I12 of the MOSFETs M11 and M12 will be given by the difference current between I5 and I9. In view of I5 $\propto$ VP, I9 $\propto^{-1}$ VP, the output voltage VOP of the non-inverting output terminal OP is a voltage corresponding to the input voltage VP. Accordingly, Equation (24) holds.

In accordance with the configuration of the circuit according to the present invention, it is possible to extend the range of the input signal and output signal and the operating signals of the circuitry. In other words, according to the present invention, even if a wide range is achieved for the input voltage, output voltage and for the operating currents of the circuitry in a MOSFET, there is little transition in the operating state of the circuitry. This means that there is little fluctuation in such circuit characteristics as output current, output voltage, frequency characteristic, amplification factor, offset voltage and consumption of power-supply current. That is, the operating characteristics of the circuit are improved.

Though the present invention has been described in accordance with the foregoing examples, the invention is not limited to these examples and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier circuit comprising:
   an input stage comprising:
      a first differential pair of a first conductivity type including an input pair connected to respective first and second input terminals and an output pair connected to a load-element pair providing a load to the first differential pair; and
      a second differential pair of a second conductivity type including an input pair connected to the respective first and second input terminals and an output pair connected to a load-element pair providing a load to the second differential pair;
   an output stage comprising:
      a first output transistor connected between a first power supply and an output terminal and including a control terminal receiving a first output of the first differential pair, the first output transistor providing an output signal to the output terminal according to the received first output of the first differential pair; and
      a second output transistor connected between a second power supply and the output terminal and including a control terminal receiving a first output of the second differential pair, the second output transistor providing an output signal to the output terminal according to the received first output of the second differential pair;
   a first current combining circuit generating a current based upon a current that flows through a second output of the first differential pair; and
   a second current combining circuit generating a current based upon a current that flows through a second output of the second differential pair,
   wherein a first current having a value resulting from adding a current of the first output of the second differential pair and a current generated by the first current combining circuit flows in the load element connected to the first output of the second differential pair,
   wherein a second current having a value resulting from adding a current of the first output of the first differential pair and a current generated by the second current combining circuit flows in the load element connected to the first output of the first differential pair, and
   wherein the values of the first and second currents does not reach a value of approximately zero.

2. The differential amplifier circuit according to claim 1, wherein said first current combining circuit includes a first current mirror in which the load element connected to the second output of the first differential pair forms an input side, and which has an output connected to the load element connected to the first output of the second differential pair, and the first current having a value resulting from adding an output current of the first current mirror to the current of the first output of the second differential pair flows in the load element connected to the first output of the second differential pair, and
   wherein said second combining circuit includes a second current mirror in which the load element connected to the second output of the second differential pair forms an input side, and which has an output connected to the load element connected to the first output of the first differential pair, and the second current having a value resulting from adding an output current of the second current mirror to the current of the first output of the first differential pair flows in the load element connected to the first output of the first differential pair.

3. The differential amplifier circuit according to claim , wherein:
   the load element connected to the first output of the first differential pair and the first output transistor form a third current mirror, and
   the load element connected to the first output of the second differential pair and the second output transistor form a fourth current mirror.

4. The differential amplifier circuit according to claim 1, wherein each of the load elements comprises a diode-connected transistor.

5. The circuit according to claim 1, wherein a phase-compensating capacitor is provided in accordance with at least one of:
   between the control terminal of the first output transistor and the output terminal, and between the control terminal of the second output transistor and the output terminal; or
   between the output pair of the first differential pair and between the output pair of the second differential pair.

6. A voltage comparator including the differential amplifier circuit set forth in claim 1.

7. An operational amplifier including the differential amplifier circuit set forth in claim 1.

8. A semiconductor device including the differential amplifier circuit set forth in claim 1.

9. The differential amplifier circuit according to claim 1, wherein a non-zero value of current is flowing through the fourth load element, and
   wherein a non-zero value of current is flowing through the second load element.

10. The differential amplifier circuit according to claim , wherein:
    a value of a current flowing through the load-element pair of the corresponding first differential pair is increased by the current from the second differential pair, and
    a value of a current flowing through the load-element pair of the corresponding second differential pair is increased by the current from the first differential pair.

11. The differential amplifier circuit according to claim 1, further comprising:
    a first phase-compensating unit adjusting a phase of signals between the first differential pair and the corresponding load pair; and
    a second phase-compensating unit adjusting a phase of signals between the second differential pair and the corresponding load pair.

12. The differential amplifier circuit according to claim 1, further comprising:
    a first phase-compensating unit compensating a phase of the first output of the first differential pair received by the first transistor with the output signal of the first transistor; and
    a second phase-compensating unit compensating a phase of the first output of the second differential pair received by the second transistor with the output signal of the second transistor.

13. The differential amplifier circuit according to claim 1, further comprising a first phase compensator providing a phase compensation for a signal of the first current and a signal of the second current flowing through the respective load elements.

14. A differential amplifier circuit comprising:
    a first differential pair including a transistor pair of a first conductivity type having coupled sources connected to a first current source, drains connected to respective first and second load elements and gates connected to respective ones of an inverting input terminal and non-inverting input terminal, wherein the first and second load elements comprise diode-connected transistors of a second conductivity type having sources connected to a first power supply;
    a second differential pair comprising a transistor pair of the second conductivity type having coupled sources connected to a second current source, drains connected to respective third and fourth load elements and gates connected to respective ones of the inverting input terminal and non-inverting input terminal, wherein the third and fourth load elements comprise diode-connected transistors of the first conductivity type having sources receiving power from a second power supply;
    a first output transistor of the second conductivity type connected between the first power supply and an output terminal and having a gate connected to a node of connection between the second load element and a first output of said first differential pair;
    a second output transistor of the first conductivity type connected between the second power supply and the output terminal and having a control terminal connected to a node of connection between the fourth load element and a first output of said second differential pair;
    a first transistor of the second conductivity type having a source connected to the first power supply and forming a current mirror with the first load element; and
    a second transistor of the first conductivity type having a source receiving power from the second power supply and forming a current mirror with the third load element,
    wherein said first transistor has a drain connected to a node of connection between the drain and gate of the fourth load element,
    wherein said second transistor has a drain connected to a node of connection between the drain and gate of the second load element, and
    wherein the values of a first current flowing through the fourth load element and a second current flowing through a second load element do not reach a value of approximately zero.

15. The differential amplifier circuit according to claim 14, wherein a phase-compensating capacitor is provided in accordance with at least one of the following:
    between the gate and drain of said first output transistor, and between the gate and drain of the second output transistor; and
    between the drains of said first differential pair and between the drains of said second differential pair.

16. A voltage comparator including the differential amplifier circuit set forth in claim 14.

17. An operational amplifier including the differential amplifier circuit set forth in claim 14.

18. A semiconductor device including the differential amplifier circuit set forth in claim 14.

19. A differential amplifier circuit comprising:
    an input stage comprising:
      a first differential pair of a first conductivity type including an input pair connected to respective first and second input terminals and an output pair connected to a load-element pair providing a load to the first differential pair; and
      a second differential pair of a second conductivity type including an input pair connected to the respective first and second input terminals and an output pair connected to a load-element pair providing a load to the second differential pair;
    an output stage receiving a first output of the first differential pair and a first output of the second differential pair of the input stage, the output stage comprising:
      a first output transistor receiving power from a first power supply and providing an output of the first output transistor to an output terminal, and the first output transistor including a control terminal receiving the first output of the first differential pair; and
      a second output transistor receiving power from a second power supply and providing an output of the second output transistor to the output terminal, and the second output transistor including a control terminal receiving the first output of the second differential pair;

a first current combining circuit generating a current based upon a current that flows through a second output of the first differential pair; and a second current combining circuit generating a current based upon a current that flows through a second output of the second differential pair, wherein a first current having a value comprising of adding a current of the first output of the second differential pair and a current generated by the first current combining circuit flows in the load element connected to the first output of the second differential pair, and the first current has a non-zero value, and wherein a second current having a value comprising of adding a current of the first output of the first differential pair and a current generated by the second current combining circuit flows in the load element connected to the first output of the first differential pair, and the second current has a non-zero value.

* * * * *